United States Patent
Kao

(10) Patent No.: US 7,411,446 B2
(45) Date of Patent: Aug. 12, 2008

(54) DC OFFSET CANCELLATION CIRCUIT

(75) Inventor: Shiau-Wen Kao, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 64 days.

(21) Appl. No.: 11/594,889

(22) Filed: Nov. 9, 2006

(65) Prior Publication Data

US 2008/0111618 A1 May 15, 2008

(51) Int. Cl.
*H03F 1/02* (2006.01)
(52) U.S. Cl. .......................... 330/9; 327/307
(58) Field of Classification Search .............. 330/9, 330/259–260, 85; 327/307; 455/232.1, 234.1, 455/244.1
See application file for complete search history.

(56) References Cited

U.S. PATENT DOCUMENTS

| | | |
|---|---|---|
| 6,442,380 B1 | 8/2002 | Mohindra |
| 6,509,777 B2 | 1/2003 | Razavi et al. |
| 6,903,593 B2 * | 6/2005 | Wang ................. 327/307 |
| 2004/0251947 A1 | 12/2004 | Wang |
| 2005/0110550 A1 * | 5/2005 | Shi et al. ............. 327/307 |

* cited by examiner

*Primary Examiner*—Benny Lee
*Assistant Examiner*—Hieu P Nguyen
(74) *Attorney, Agent, or Firm*—Finnegan, Henderson, Farabow, Garrett & Dunner LLP

(57) ABSTRACT

A DC offset cancellation block is provided for canceling a DC offset in a signal path. The signal path may include an input and an output. The DC offset cancellation block may include an active integrator coupled between the input and the output to provide a negative feedback to the signal path. The active integrator may include an operational-amplifier (op-amp), a capacitive component with a capacitance C, and a resistive component with a resistance R, and the capacitive component may be coupled to the op-amp via a closed feedback loop. The DC offset cancellation block may also include a first amplifier with a gain of $G_A$ coupled with the capacitive component in the closed feedback loop such that a RC time constant of the active integrator is changed from RC to $RCG_A$.

23 Claims, 2 Drawing Sheets

DC OFFSET CANCELLATION CIRCUIT

TECHNICAL FIELD

The present invention generally relates to direct current (DC) offset cancellation circuit technologies and, more particularly, to techniques related to canceling DC offset in integrated circuits for communication devices.

BACKGROUND

Integrated circuits used in communication devices, such as wireless communication devices, are often required to perform signal processing in environments that are very sensitive to the introduction of a signal offset, such as noise. The signal offset represents a deviation in the intended value of a circuit reference signal introduced in the processes of transmitting and receiving signals. The signal offset may affect the DC performance of a circuit by causing a presence of an offset current or offset voltage that is indistinguishable from the reference signal, which may further lead to undesired effects, such as circuit saturation and, potentially, circuit malfunction. For example, in highly integrated wireless transceivers, DC offset may be introduced in radio frequency (RF) front end circuitries or in baseband circuitries. Such DC offset may be amplified by various amplifiers in the baseband circuitries and may cause saturation and/or undesired interference in the baseband circuitries.

Techniques have been developed to reduce or cancel DC offset by using alternating current (AC) coupled or single pole low-pass filters. For example, U.S. Pat. No. 6,509,777 issued to Razavi et al. on Jan. 21, 2003, discloses a DC offset reduction circuit using a AC coupled feedback loop with a programmable gain transconductance amplifier of programmable gain. However, such conventional techniques often require a large RC time constant, which may result in a large die footprint or size for the DC offset reduction circuit and an increase in DC offset reduction time. Under certain circumstances, the increased time for reducing or canceling the DC offset may be undesirable in many wireless communication systems, such as wireless local area network (WLAN) or world interoperability for microwave access (WiMAX), etc.

Methods and systems consistent with certain features of the disclosed embodiments are directed to solving one or more of the problems set forth above.

SUMMARY OF THE INVENTION

Examples of the invention may provide a DC offset cancellation block for canceling a DC offset in a signal path. The signal path may include an input and an output. The DC offset cancellation block may include an active integrator coupled between the input and the output to provide a negative feedback to the signal path. The active integrator may include an operational-amplifier (op-amp), a capacitive component with a capacitance C, and a resistive component with a resistance R, and the capacitive component may be coupled to the op-amp via a closed feedback loop. The DC offset cancellation block may also include a first amplifier with a gain of $G_A$ coupled with the capacitive component in the closed feedback loop such that a RC time constant of the active integrator is changed from RC to $RCG_A$.

Examples of the invention may also provide a DC offset cancellation block for canceling a DC offset in a signal path. The signal path may include an input having a first terminal and a second terminal and an output having a first terminal and a second terminal. The DC offset cancellation block may include a first and second resistive components and a first and a second capacitive components. The DC offset cancellation block may also include a first amplifier and a second amplifier. The first amplifier may include a first input, a second input, and an output, and the second amplifier may also include a first input, a second input, and an output. Further, the DC offset cancellation block may include an operational amplifier (op-amp) having a non-inverting input, an inverting input, a non-inverting output, and an inverting output. The non-inverting input of the op-amp may be coupled to the first terminal of the output via the first resistive component; the inverting input of the op-amp may be coupled to the second terminal of the output via the second resistive component; the non-inverting input of the op-amp may be coupled to the output of the first amplifier via the first capacitive component; the inverting input of the op-amp may be coupled to the output of the second amplifier via the second capacitive component; the inverting output of the op-amp may be coupled to the first input of the first amplifier; the non-inverting output of the op-amp may be coupled to the second input of the first amplifier; the non-inverting output of the op-amp may be coupled to the first input of the second amplifier; and the inverting output of the op-amp may be coupled to the second input of the second amplifier.

Examples of the invention may also provide a wireless communication terminal. The terminal may include a transceiver configured to receive and transmit communication signals. The transceiver may include a signal path having an input and an output and an active integrator. The active integrator may be coupled between the input and the output to provide a negative feedback to the signal path. The active integrator may include an operational-amplifier (op-amp), a capacitive component with a capacitance C, and a resistive component with a resistance R, and the capacitive component is coupled to the op-amp via a closed feedback loop. Further, the transceiver may also include a first amplifier with a gain of $G_A$ and the first amplifier may be coupled with the capacitive component in the closed feedback loop such that a RC time constant of the active integrator is changed from RC to $RCG_A$.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
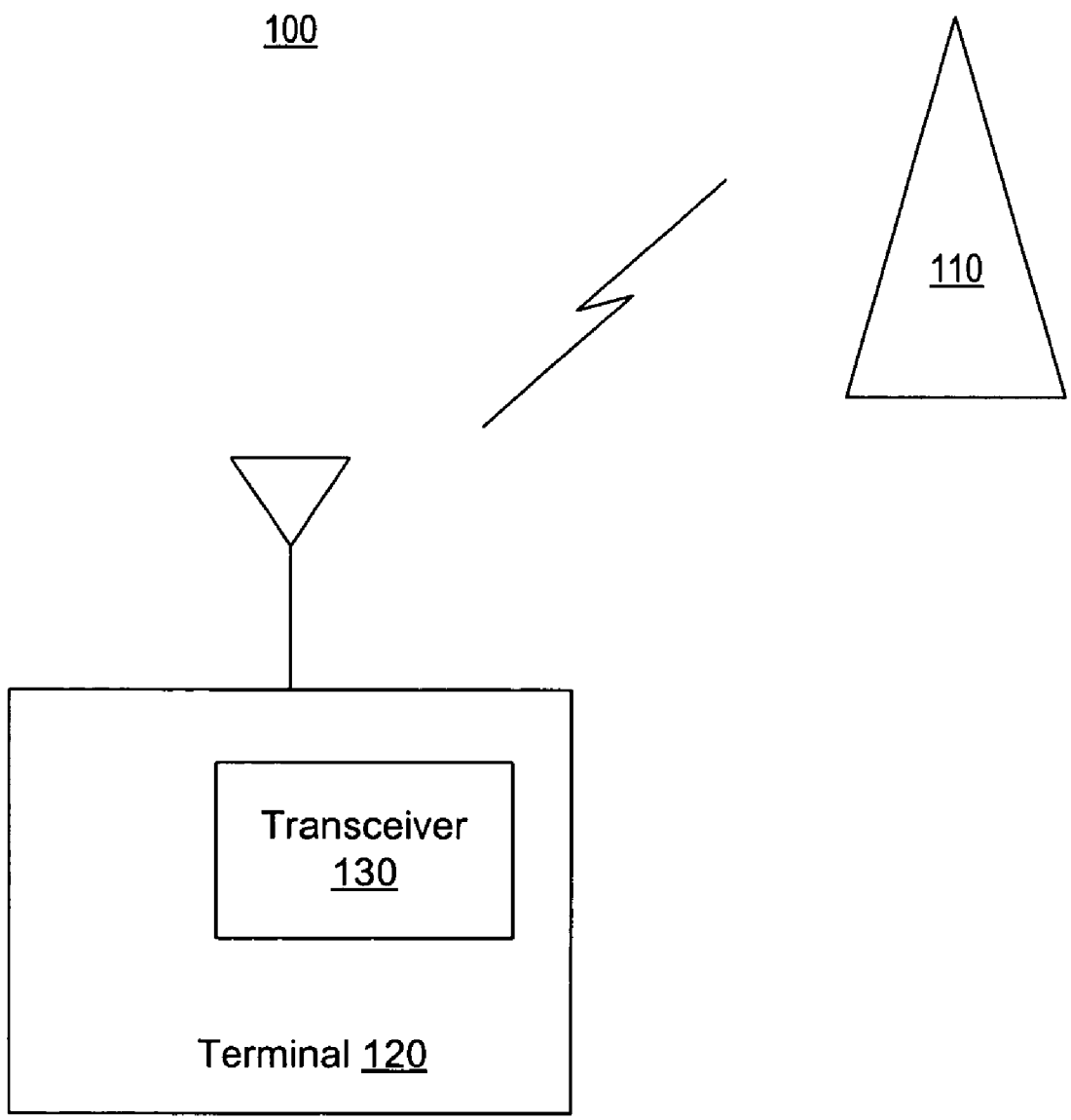
FIG. 1 shows an exemplary communication environment incorporating features consistent with the invention.

FIG. 1 shows an exemplary communication environment 100 incorporating features consistent with the present invention. As shown in FIG. 1, communication environment 100, such as a wireless communication network using various standards, e.g., WLAN, WiMAX, etc., may include a base station 110 and a communication terminal 120. The number of base stations and communication terminals is exemplary only and not intended to be limiting. Any number of base stations and communication terminals may be used, and other devices may be added, without departing from the principles of the present invention.

Base station 110 may be any appropriate type of wireless or radio base station, such as a land based communication base station or a satellite based communication device. Communication terminal 120 may be any appropriate communication terminal capable of communicating with base station 110 based on any of the various communication standards. Communication terminal 120 may also be configured to communicate with other communication terminals (not shown) directly or indirectly via base station 110. Communication terminals 120 may include a wireless communication transceiver 130 for carrying out the communication between communication terminal 120 and base station 110 and/or between communication terminal 120 and the other communication terminals, such as receiving and/or transmitting communication signals.

Transceiver 130 may include any appropriate type of communication transceiver, i.e., a combination of a transmitter and a receiver having a common frequency control. The transmitter and the receiver may be enclosed in a single package or in different packages. Transceiver 130 may include various circuitries provided for processing signals generated during the transmitting and/or receiving operations of transceiver 130.

Figure 2:
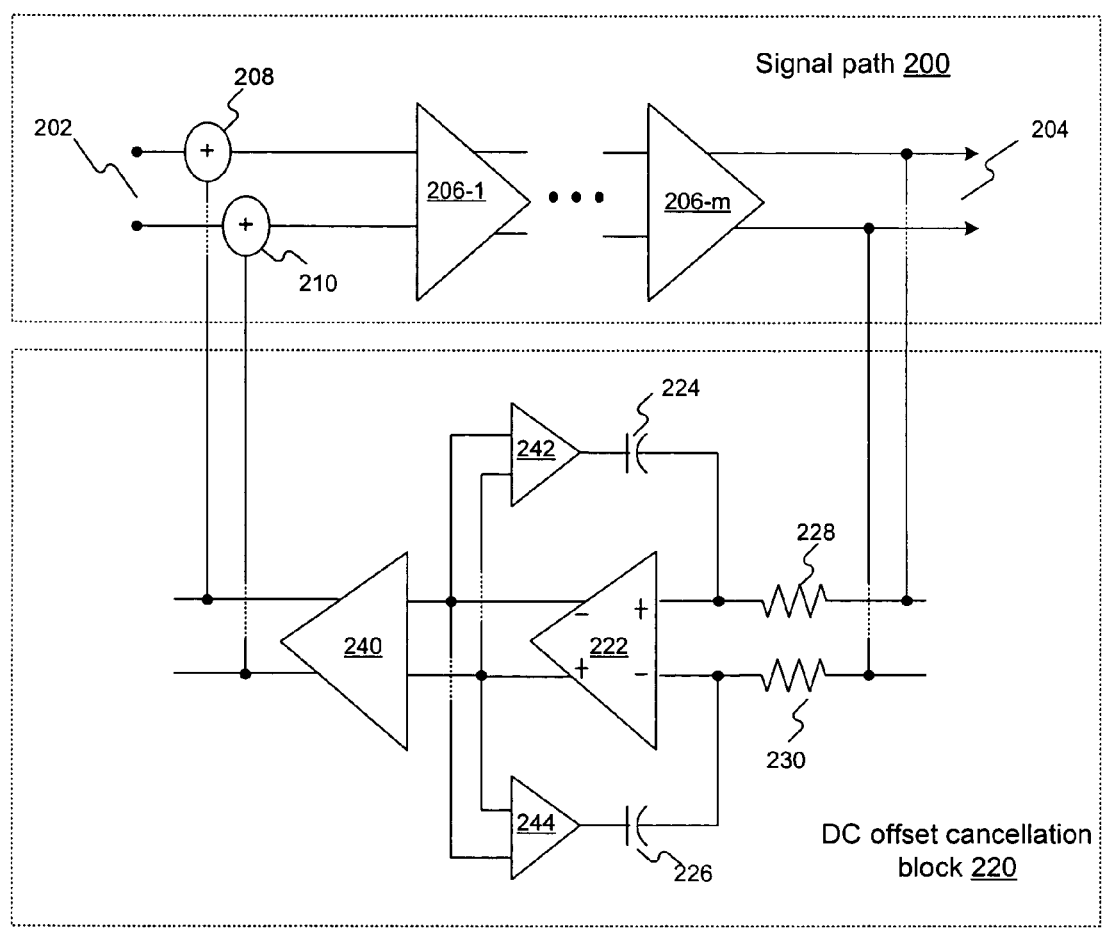
FIG. 2 is shows exemplary circuitry consistent with the present invention.

FIG. 2 shows exemplary circuitry included in transceiver 130. As shown in FIG. 2, transceiver 130 may include a signal path 200 and a DC offset cancellation block 220. Signal path, as used herein, may refer to any part or section of a circuit configured to process one or more signals. Signal path 200 may include appropriate circuits or devices to process signals during receiving and/or transmitting operation of transceiver 130. For example, signal path 200 may include an input 202, an output 204, a plurality of amplifiers 206-1 to 206-$m$, and adders 208 and 210.

DC offset cancellation block 220 may include appropriate circuits or devices to cancel or reduce a DC offset in signal path 200. For example, DC offset cancellation block 220 may include operational amplifiers (op-amp) 222, capacitors 224 and 226, resistors 228 and 230, amplifier 240, amplifier 242, and amplifier 244. The circuitry shown in FIG. 2 is for illustrative purposes, certain devices may be removed and other devices may be added without departing from the principle of the present invention. Further, the circuitry of signal path 200 and/or DC offset cancellation block 220 may be implemented in large scale integration (LSI) or very large scale integration (VLSI) devices using, for example, complementary metal-oxide semiconductor (CMOS) or bipolar complementary metal-oxide semiconductor (BiCMOS) technologies. Other technologies, however, may also be used.

Input 202 may include any appropriate input signal provided to transceiver 130 or processed by transceiver 130. For example, input 202 may be a front-end signal from an antenna or a radio frequency (RF) circuit and may be represented by a voltage signal ($V_{in}$) and/or a current signal ($I_{in}$). Input 202 may be carried by two input terminals or lines. Input signals may be provided to signal path 200 via input 202, e.g., input terminals of input 202, to be processed and/or amplified by a plurality of amplifiers 206-1 to 206-$m$, where m is total number of amplifiers (or amplifier equivalents) in signal path 200. The plurality of amplifiers 206-1 to 206-$m$ may include any appropriate amplifiers, such as op-amps.

Output 204 may include output signals of signal path 200. Output 204 may correspond to input 202 and may include input signals of input 202 processed and/or amplified by signal path 200, e.g., amplifiers 206-1 to 206-$m$. Output 204 may also be represented by a voltage signal ($V_{out}$) and/or a current signal ($I_{out}$), and may be carried by two output terminals or lines. Further, although input 202 and output 204 as shown have coupled therebetween the entire signal path 200, input 202 and output 204 may couple between any section of signal path 200. For example, input 202 and output 204 may be input and output, respectively, of amplifier 206-1 or any number of amplifiers of amplifiers 206-1 to 206-$m$.

At certain times, input 202 may include a DC offset when provided to signal path 200. The DC offset may be further amplified by signal path 200 and be included in output 204. The DC offset in output 204 may thus be related to the DC offset in input 202. DC offset cancellation block 220 may then be used to cancel or reduce the DC offset in input 202 and output 204.

DC offset cancellation block 220 may be coupled to input 202, e.g., input terminals of input 202, and output 204, e.g., output terminals of output 204, in parallel with signal path 200 and may provide a DC negative feedback through adders 208 and 210 to signal path 200. Negative feedback, as used herein, may refer to a feedback in which a portion of an output signal from a later amplifier stage is fed back to an earlier stage (or to the same stage) in such a manner as to subtract from an input signal. The DC negative feedback to signal path 200 may use a portion of DC offset in output 204 to cancel or reduce the DC offset in input 202 within signal path 200. The DC negative feedback may be generated by an active integrator based on op-amp 222 of DC offset cancellation block 220.

An active integrator may include any appropriate integration circuitry that requires electrical power for operation, such as an op-amp based integrator. An active integrator, as used herein with respect to op-amp 222, may also refer to an op-amp in an inverting configuration with one or more feedback capacitors and resistors, i.e., an active resistor and capacitor integrator. Op-amp 222 may include any appropriate op-amp used for feedback or negative feedback purposes. Being used to provide a negative feedback, inputs of op-amp 222 may be coupled to output 204, e.g., output terminals of output 204. In particular, a non-inverting input of op-amp 222 may be coupled to one output terminal of output 204 via resistor 228, and an inverting input of op-amp 222 may be coupled to the other output terminal of output 204 via resistor 230.

Resistors 228 and 230 may have the same resistance and may include any appropriate resistors used in circuitry or integrated circuitry, such as high resistance poly resistors or metal-oxide semiconductor (MOS) resistors, etc. Resistors 228 and 230 may also include any appropriate circuit or integrated circuit components with certain resistance, i.e., resistive components. The non-inverting input of op-amp 222 may also be coupled to capacitor 224, which may be further coupled to an output of amplifier 242; and the inverting input of op-amp 222 may be coupled to capacitor 226, which may be further coupled to an output of amplifier 244. Capacitor 224 and capacitor 226 may have the same capacitance and may include any appropriate capacitors used in circuitry or integrated circuitry, such as Metal-insulator-Metal (MIM) capacitors, Metal-oxide-Metal (MOM) capacitors, Poly-insulator-Poly (PIP) capacitors, and/or MOS capacitors, etc. Capacitors 224 and 226 may also include any appropriate circuit or integrated circuit components with electrical charge/discharge abilities or with certain capacitance, i.e., capacitive components.

Further, amplifier 242 and amplifier 244 may also coupled back to op-amp 222 to form respective closed feedback loops. For example, one input of amplifier 242 may be coupled to an inverting output of op-amp 222; and the other input of amplifier 242 may be coupled to a non-inverting output of op-amp 222. Further, one input of amplifier 244 may be coupled to the non-inverting output of op-amp 222; and the other input of op-amp 244 may be coupled to the inverting output of op-amp 222.

Amplifier 242 and amplifier 244 may be referred to as feedback voltage gain amplifiers and may include any appropriate amplifiers used in circuitry or integrated circuitry. For example, amplifier 242 and amplifier 244 may include source-couple pair amplifiers or operational amplifiers (op-amps). Outputs of op-amp 222 may be coupled to input 202, e.g., input terminals of input 202, to form a negative feedback loop. For example, both outputs of op-amp 222 may be coupled to two input terminals of input 202 through two respective adders 208 and 210. Adders 208 and 210 may include any appropriate adders used in circuitry or integrated circuitry.

In certain embodiments, amplifier 240 may be coupled between op-amp 222 and adders 208 and 210 to adjust gain of the active integrator and/or to adjust amount of negative feedback to input 202. Adders 208 and 210 may operate as voltage adders or as current adders. If input 202 and the negative feedback to input 202 are both in voltage forms, adders 208 and 210 may operate as voltage adders to add together input 202 and the negative feedback. On the other hand, signal path 200 may include input resistors (not shown) to translate input 202 from voltage form to current form, and adders 208 and 210 may operate as current adders to add the currents corresponding to input 202 and the negative feedback. The amount of the negative feedback to input 202 may be determined by the gain of amplifier 240. Amplifier 240 may be coupled to a resistor (not shown) and the gain of amplifier 240 may be determined based on a resistor ratio between an input resistor and the resistor coupled to amplifier 240. Thus, by adjusting the resistor ratio, the gain of amplifier 240 may be adjusted to a desired value to provide proper negative feedback to input 202.

As explained above, DC offset cancellation block 220 may include an op-amp 222 based active integrator for negative feedback. For example, op-amp 222, coupled with resistor 228 and capacitor 224, may represent an active low pass filter or an active resistor and capacitor integrator. Similarly, op-amp 222 coupled with resistor 230 and capacitor 226 may also represent an active low pass filter or an active resistor and capacitor integrator. Further, putting together op-amp 222 coupled with resistors 228 and 230 and capacitors 224 and 226 may also represent an active low pass filter or an active resistor and capacitor integrator. The DC offset in output 204 may be filtered through the active low pass filter, adjusted with proper gain, and negatively fedback to input 202 to cancel or significantly reduce the DC offset in input 202.

Characteristics of op-amp 222 based active integrators may be further improved by respective coupled-in amplifiers 242 and/or 244 in the capacitor feedback loops of the active integrators, which may have a same gain of $G_{A_1}$. In operation, the op-amp 222 based active integrator or low pass filter may be described by the following equation:

$$G_{A_1} V_{out} * SC + \frac{V_{in}}{R} = 0, \quad (1)$$

where $G_{A_1}$ is the gain of amplifiers 242 and 244 (e.g., op-amps), R is the resistor value or resistance of resistors 228 and/or 230, C is the capacitor value or capacitance of capacitors 242 and/or 244, $V_{out}$ is the voltage of output 204, $V_{in}$ is the voltage of input 202, and S is the complex frequency term of the Laplace transform. Further, from equation (1), the gain of the active integrator or active resistor and capacitor integrator may be derived as:

$$G_{A_v} = \frac{V_{out}}{V_{in}} = \frac{-1}{S(RG_{A_1}C)} = 0. \quad (2)$$

As shown in equation (2), the RC time constant of op-amp 222 based active integrator is increased $G_{A_1}$ times by coupling feedback voltage gain amplifier 242 and/or amplifier 244. The actual or improved RC time constant is $RCG_{A_1}$. Thus, the original RC time constant, i.e., RC, may be reduced significantly when amplifiers 242 and 244 are implemented to have gain $G_{A_1}$. For example, $G_{A_1}$ may be in a range of approximately 30 to 50, which means the original RC value may be reduced by 30 or 50 times and still have the same equivalent RC time constant. Other ranges, however, may also be used.

Further, because the die size for DC offset cancellation block 220, when implemented in integrated circuits, may be proportional to the original RC time constant of the active integrator, a significant decrease in the value of the original RC time constant may also significantly reduce the die size of DC offset cancellation block 200. For example, capacitances of capacitor 224 and 226 may be reduced from an original value of approximately 75 pF to an actual value of approximately 6 pF such that a substantial reduction of die size of DC offset cancellation block 200 may be realized.

As explained above, DC offset cancellation block 220 may be used to provide negative feedback to signal path 200. Because the op-amp 222 based active integrator is also a low pass filter, high frequency components of output 204 may be filtered out by the active low pass filter and only remaining DC and/or low frequency components are fed back to signal path 200 via adders 208 and 210 in inverse polarity. That may result in high frequency components being kept in signal path 200, while the DC and low frequency components may be canceled or significantly reduced.

Further, the gain $G_{A_1}$ of voltage feedback amplifiers 242 and 244 may be automatically adjusted corresponding to the amount of DC offset in output 204 to be canceled or reduced. For example, when the DC offset in output 204 is large, e.g., at the beginning of DC offset cancellation operation, amplifier 242 and/or amplifier 244 may also have a large DC offset at their corresponding inputs. With a large DC offset at their inputs, $G_{A_1}$ may be decreased. From equation (2), the decreased $G_{A_1}$ may reduce the actual RC time constant significantly.

With a reduced actual RC time constant, the op-amp 222 based active low pass filter may generate an increased negative feedback such that the DC offset in input 202 may be canceled or reduced faster than that with a non-reduced or constant actual RC time constant. After a certain period of time, e.g., 10 to 30 microseconds, of continuous cancellation operation, the DC offset in input 202 may be canceled or reduced. Further, during the process in which the DC offset in input 202 is canceled or reduced, the DC offset in output 204 may also be canceled or reduced. The DC offset at the inputs of amplifiers 242 and/or 244 may therefore also be canceled or reduced, which may cause $G_{A_1}$ and the actual RC time constant to recover to their respective original values.

Further, amplifier 240 may include any appropriate voltage gain amplifier, such as an op-amp or a source-couple pair amplifier, etc. Amplifier 240 may be provided to compensate or adjust the gain of the negative feedback loop. For example, amplifier 240 may maintain a proper gain of DC offset cancellation block 220 after the DC offset in output 204 or input 202 is canceled or significantly reduced. More specifically, amplifier 240 may prevent the gain of the feedback loop from becoming too small for normal operation.

By coupling one or more amplifiers into an active resistor and capacitor integrator used in a negative feedback loop for DC offset cancellation, the RC time constant and, more particularly, the capacitor value of the active integrator may be significantly reduced. Therefore, the die size of the active integrator may also be significantly reduced. In addition, the gain of the coupled-in one or more amplifiers may change corresponding to the amount of DC offset presented in a circuitry such that the amount of cancellation of the DC offset may be proportional to the amount of the DC offset. Thus, the speed of DC offset cancellation may also be significantly increased.

Further, although FIG. 2 shows that a single loop feedback DC offset cancellation circuit is used, other configurations, such as multiple feedback loops using DC offset cancellation circuit, may also be used.

It is intended that the specification and examples be considered as exemplary only. Other embodiments of the invention will be apparent to those skilled in the art from consideration of the specification and practice of the invention disclosed herein.

What is claimed is:

1. A DC offset cancellation block for canceling a DC offset in a signal path with an input and an output, comprising:
    an active integrator coupled between the input and the output to provide a negative feedback to the signal path, the integrator including an operational-amplifier (op-amp), a capacitive component with a capacitance C, and a resistive component with a resistance R, wherein the capacitive component is coupled to the op-amp via a closed feedback loop; and
    a first amplifier with a gain of $G_A$ coupled with the capacitive component in the closed feedback loop such that a RC time constant of the active integrator is changed from RC to $RCG_A$.

2. The DC offset cancellation block according to claim 1, wherein the first amplifier is one of a source-couple pair amplifier and an op-amp.

3. The DC offset cancellation block according to claim 1, further including:
    a second amplifier coupled to the active integrator to adjust an amount of the negative feedback provided by the active integrator to the signal path.

4. The DC offset cancellation block according to claim 3, wherein the second amplifier is one of a source-couple pair amplifier and an op-amp.

5. The DC offset cancellation block according to claim 1, wherein the active integrator is implemented in one of complementary metal-oxide semiconductor (CMOS) and bipolar complementary metal-oxide semiconductor (BiCMOS).

6. The DC offset cancellation block according to claim 1, wherein the capacitive component includes one of a metal-insulator-metal (MIM) capacitor, a metal-oxide-metal (MOM) capacitor, a poly-insulator-poly (PIP) capacitor, and a metal-oxide semiconductor (MOS) capacitor.

7. The DC offset cancellation block according to claim 1, wherein the resistive component includes one of a high resistance poly resistor and a metal-oxide semiconductor (MOS) resistor.

8. A DC offset cancellation block for canceling a DC offset in a signal path with an input having a first terminal and a second terminal and an output having a first terminal and a second terminal, comprising:
    a first resistive component and second resistive component;
    a first capacitive component and a second capacitive component;
    a first amplifier having a first input, a second input, and an output;
    a second amplifier having a first input, a second input, and an output; and
    an operational amplifier (op-amp) having a non-inverting input, an inverting input, a non-inverting output, and an inverting output,
    wherein:
        the non-inverting input of the op-amp is coupled to the first terminal of the output via the first resistive component;
        the inverting input of the op-amp is coupled to the second terminal of the output via the second resistive component;
        the non-inverting input of the op-amp is coupled to the output of the first amplifier via the first capacitive component;
        the inverting input of the op-amp is coupled to the output of the second amplifier via the second capacitive component;
        the inverting output of the op-amp is coupled to the first input of the first amplifier;
        the non-inverting output of the op-amp is coupled to the second input of the first amplifier;
        the non-inverting output of the op-amp is coupled to the first input of the second amplifier; and
        the inverting output of the op-amp is coupled to the second input of the second amplifier.

9. The DC offset cancellation block according to claim 8, wherein:
    the inverting output of the op-amp is coupled to the first terminal of the input via a first adder; and
    the non-inverting output of the op-amp is coupled to the second terminal of the input via a second adder.

10. The DC offset cancellation block according to claim 9, further including:
    a third amplifier coupled between the op-amp and the first and second adders.

11. The DC offset cancellation block according to claim 8, wherein the first amplifier is one of a source-couple pair amplifier and an op-amp.

12. The DC offset cancellation block according to claim 8, wherein the second amplifier is one of a source-couple pair amplifier and an op-amp.

13. The DC offset cancellation block according to claim 10, wherein the third amplifier is one of a source-couple pair amplifier and an op-amp.

14. The DC offset cancellation block according to claim 10, wherein the DC offset cancellation block is implemented in one of complementary metal-oxide semiconductor (CMOS) and bipolar complementary metal-oxide semiconductor (BiCMOS).

15. The DC offset cancellation block according to claim 8, wherein the first capacitive component and the second capacitive component each includes one of a metal-insulator-metal (MIM) capacitor, a metal-oxide-metal (MOM) capacitor, a poly-insulator-poly (PIP) capacitor, and a metal-oxide semiconductor (MOS) capacitor.

16. The DC offset cancellation block according to claim 8, wherein the first resistive component and the second resistive component each includes one of a high resistance poly resistor and a metal-oxide semiconductor (MOS) resistor.

17. A wireless communication terminal, comprising:
a transceiver configured to receive and transmit communication signals, the transceiver including:
- a signal path with an input and an output;
- an active integrator coupled between the input and the output to provide a negative feedback to the signal path, the integrator including an operational-amplifier (op-amp), a capacitive component with a capacitance C, and a resistive component with a resistance R, wherein the capacitive component is coupled to the op-amp via a closed feedback loop; and
- a first amplifier with a gain of $G_A$ coupled with the capacitive component in the closed feedback loop such that a RC time constant of the active integrator is changed from RC to $RCG_A$.

18. The terminal according to claim 17, wherein the first amplifier is one of a source-couple pair amplifier and an op-amp.

19. The terminal according to claim 17, wherein the transceiver further includes a second amplifier coupled to the active integrator to adjust an amount of the negative feedback provided by the active integrator to the signal path.

20. The terminal according to claim 19, wherein the second amplifier is one of a source-couple pair amplifier and an op-amp.

21. The terminal according to claim 17, wherein the transceiver is implemented in one of complementary metal-oxide semiconductor (CMOS) and bipolar complementary metal-oxide semiconductor (BiCMOS).

22. The terminal according to claim 17, wherein the capacitive component includes one of a metal-insulator-metal (MIM) capacitor, a metal-oxide-metal (MOM) capacitor, a poly-insulator-poly (PIP) capacitor, and a metal-oxide semiconductor (MOS) capacitor.

23. The terminal according to claim 17, wherein the resistive component includes one of a high resistance poly resistor and a metal-oxide semiconductor (MOS) resistor.

\* \* \* \* \*